(12) United States Patent
Kuo (10) Patent No.: US 11,049,715 B2
(45) Date of Patent: Jun. 29, 2021

(54) METHOD FOR MANUFACTURING A SEMICONDUCTOR STRUCTURE

(71) Applicant: NANYA TECHNOLOGY CORPORATION, New Taipei (TW)

(72) Inventor: Chin-Te Kuo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 148 days.

(21) Appl. No.: 16/413,232

(22) Filed: May 15, 2019

(65) Prior Publication Data

US 2020/0365390 A1  Nov. 19, 2020

(51) Int. Cl.
  *H01L 21/02* (2006.01)
  *H01L 21/8234* (2006.01)
  *H01L 27/088* (2006.01)
  *H01L 21/3065* (2006.01)

(52) U.S. Cl.
  CPC ...... *H01L 21/0223* (2013.01); *H01L 21/3065* (2013.01); *H01L 21/823431* (2013.01); *H01L 21/823481* (2013.01); *H01L 27/0886* (2013.01)

(58) Field of Classification Search
  None
  See application file for complete search history.

(56) References Cited

U.S. PATENT DOCUMENTS

| | | | | |
|---|---|---|---|---|
| 10,109,531 B1* | 10/2018 | Hsu | ............... | H01L 21/76229 |
| 2014/0001540 A1* | 1/2014 | Wang | ............... | H01L 29/6659 |
| | | | | 257/329 |
| 2016/0148998 A1 | 5/2016 | Wu et al. | | |
| 2019/0043760 A1 | 2/2019 | Hsu et al. | | |

* cited by examiner

*Primary Examiner* — Jack S Chen
(74) *Attorney, Agent, or Firm* — Muncy, Geissler, Olds & Lowe, P.C.

(57) ABSTRACT

A method for manufacturing a semiconductor structure is provided. The method includes the following steps. A fin structure having a base and a plurality of fin portions extending away from the base is provided. A portion of the fin structure in a first region is removed to form a first trench in the base and a first bump formed in the first trench. A first oxide layer is formed in the first region. The first oxide layer is removed.

19 Claims, 6 Drawing Sheets

METHOD FOR MANUFACTURING A SEMICONDUCTOR STRUCTURE

TECHNICAL FIELD

The present disclosure relates to a method for manufacturing a semiconductor structure, and more particularly, to a method for manufacturing a semiconductor structure with at least a trench and a bump.

DISCUSSION OF THE BACKGROUND

Semiconductor devices are essential for many modern applications. With the advancement of electronic technology, semiconductor devices are steadily becoming smaller and smaller while providing greater functionality and including greater amounts of integrated circuits. To meet the needs arising from the miniaturized scale of semiconductor devices, conventional semiconductor structures include a fin structure.

A method for manufacturing the conventional semiconductor structure includes providing a semiconductor substrate having a base; and forming a plurality of fin portions protruding from the base of the semiconductor substrate.

However, currently, distances between the fin portions are becoming shorter and shorter, and this results in disturbance to elements formed subsequently.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor structure. The method includes providing a fin structure having a base and a plurality of fin portions extending away from the base; partially removing the fin structure in a first region to form a first trench in the base and a first bump formed in the first trench; forming a first oxide layer in the first region of the fin structure; and removing the first oxide layer.

In some embodiments, the first oxide layer is formed through a chemical oxidation process.

In some embodiments, the first oxide layer is formed using nitric acid and hydrogen peroxide.

In some embodiments, the first oxide layer is formed through oxidizing a first exposed surface of the first trench.

In some embodiments, the method further includes performing a first pre-treatment process on the first exposed surface of the first trench before forming the first oxide layer through oxidizing the first exposed surface of the first trench.

In some embodiments, the method further includes forming a first dielectric layer entirely covering the fin portions before the partial removing of the fin structure in the first region; and disposing a first masking layer over the first dielectric layer, wherein the first masking layer has a first through hole corresponding to the first region.

In some embodiments, the partial removing of the fin structure in the first region further includes: removing the first dielectric layer exposed by the first through hole.

In some embodiments, the first dielectric layer in a region other than the first region is left in place during the forming of the first oxide layer in the first region.

In some embodiments, the partial removing of the fin structure in the first region further includes: removing the fin portions in the first region.

In some embodiments, the fin structure in the first region is removed through a dry etching process.

In some embodiments, the method further includes forming a second oxide layer in the first region after the removing of the first oxide layer; and removing the second oxide layer.

In some embodiments, the second oxide layer is formed through oxidizing a second exposed surface of the first trench.

In some embodiments, the first dielectric layer in a region other than the first region is left in place during the forming of the second oxide layer in the first region.

In some embodiments, the method further includes performing a second pre-treatment process on the second exposed surface of the first trench before the forming of the second oxide layer through oxidizing the second exposed surface of the first trench.

In some embodiments, the method further includes partially removing the fin structure in a second region to form a plurality of second trenches in the base.

In some embodiments, the second trenches are formed before the forming of the first trench, and a plurality of second bumps are respectively formed between the first trench and the second trenches.

In some embodiments, the method further includes forming a second dielectric layer entirely covering the fin portions before partially removing the fin structure in the second region; and disposing a second masking layer over the second dielectric layer, wherein the second masking layer has a plurality of second through holes corresponding to the second region.

In some embodiments, the partial removing of the fin structure in the second region further includes: partially removing the second dielectric layer exposed by the second through holes; and removing the fin portions in the second region to respectively form the second trenches.

In some embodiments, the fin structure in the second region is removed through a dry etching process.

In some embodiments, the method further includes forming a liner structure covering the base of the fin structure and partially covering the plurality of fin portions; and forming an isolation layer over the base of the fin structure and covering the liner structure.

With the design of the method for manufacturing the semiconductor structure, the trench and the bump may be used to provide better isolation and result in less disturbance to elements formed subsequently.

In addition, corners of the semiconductor structure can be made more rounded after forming an oxide layer on the exposed surface and removing the first oxide layer. Such operations can reduce an effect of parasitic capacitance and result in less disturbance to elements formed subsequently.

Moreover, forming the deeper trench after removing the first oxide layer provides better isolation and leads to less disturbance to elements formed subsequently.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

References to "one embodiment," "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprise" and "comprising," when used in this specification, point out the presence of stated features, integers, steps, operations, elements, or components, but do not preclude the presence or addition of one or more other features, integers, steps, operations, elements, components, or groups thereof.

Figure 1:
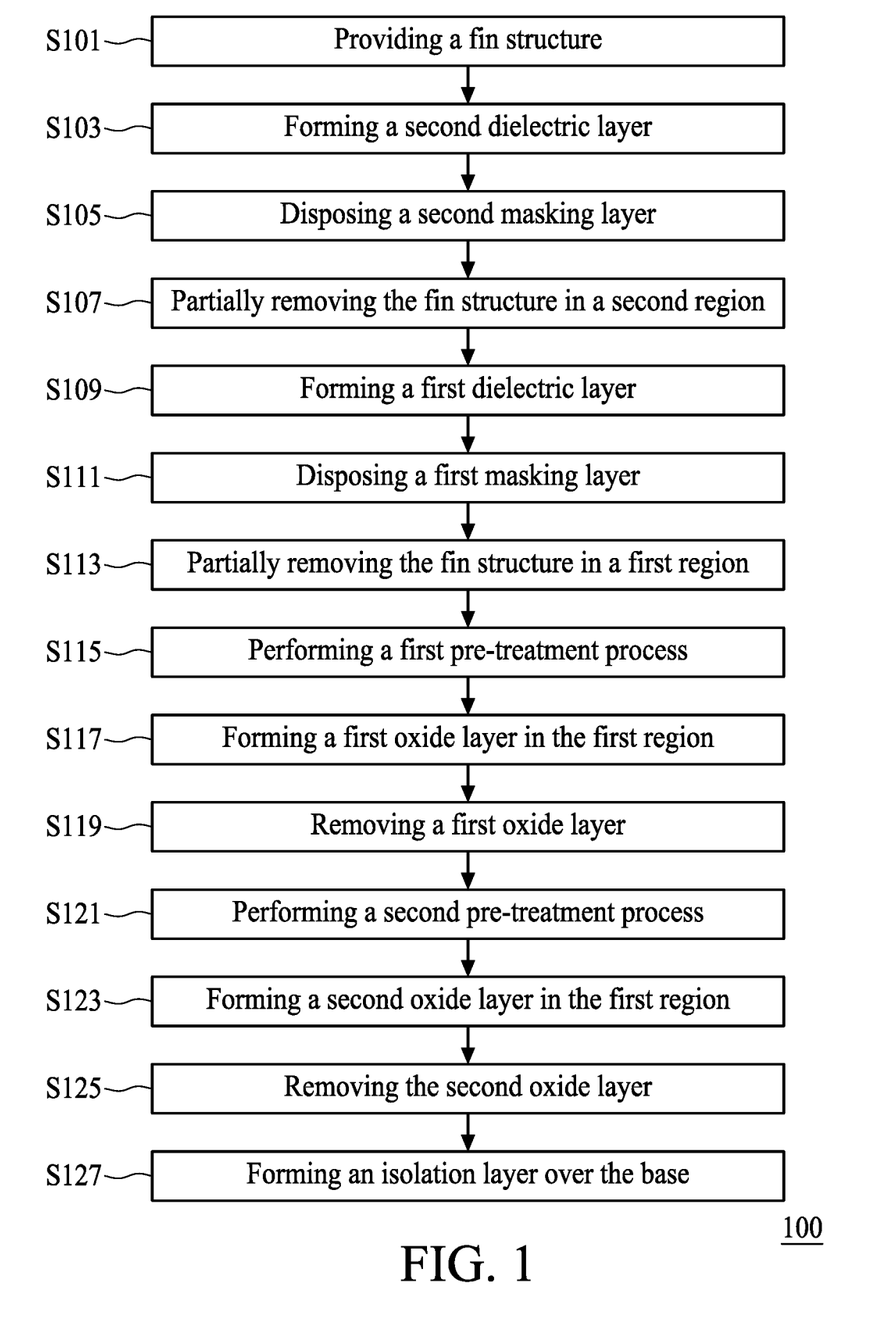
FIG. 1 is a flow diagram illustrating a method for manufacturing a semiconductor structure in accordance with some embodiments of the present disclosure.
Figure 2:
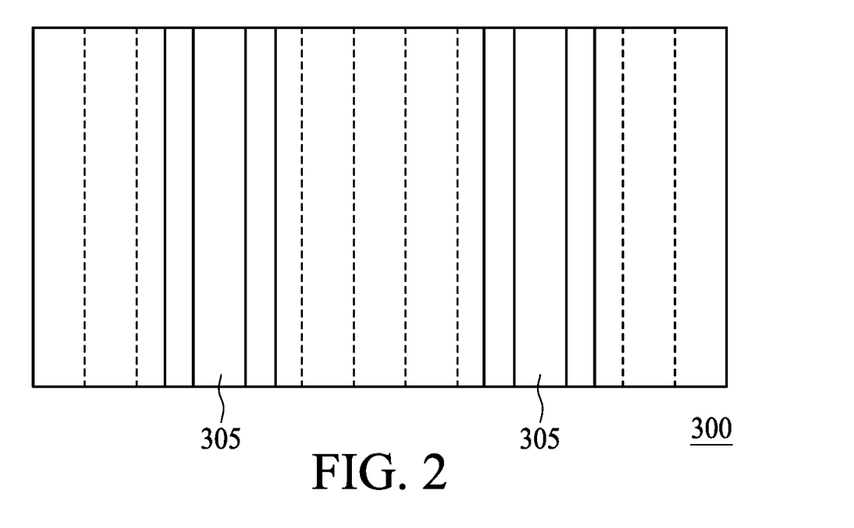
FIG. 2 is a plan view of a fin structure in accordance with some embodiments of the present disclosure.

FIG. 1 is a flow diagram illustrating a method for manufacturing a semiconductor structure in accordance with some embodiments of the present disclosure. FIG. 2 is a plan view of a fin structure 300 in accordance with some embodiments of the present disclosure. FIGS. 3 to 11 are schematic views illustrating stages of manufacturing a semiconductor structure 200 by the method of FIG. 1 in accordance with some embodiments of the present disclosure. In some embodiments, the method 100 of FIG. 1 for manufacturing the semiconductor structure 200 includes a number of operations (S101, S103, S105, S107, S109, S111, S113, S115, S117, S119, S121, S123, S125, and S127), and the description and illustration below are not deemed as a limitation as the sequence of the operations.

Figure 3:
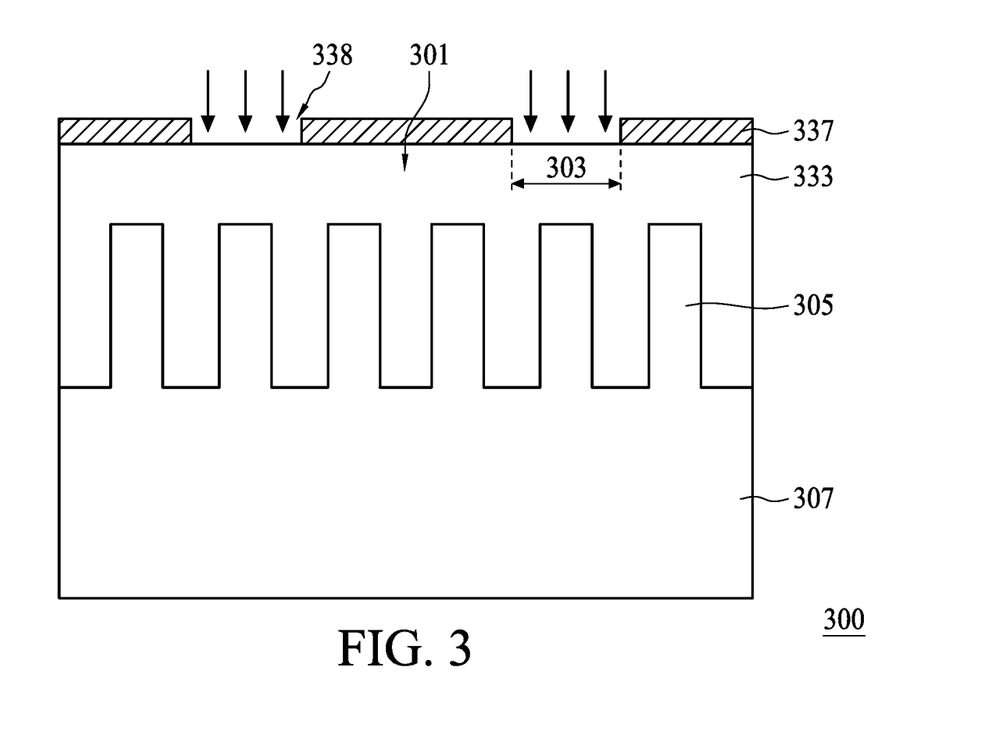
FIGS. 3 to 11 are schematic views illustrating stages of manufacturing a semiconductor structure by the method of FIG. 1 in accordance with some embodiments of the present disclosure.

In operation s101, as shown in FIG. 2 and FIG. 3, a fin structure 300 is provided. The fin structure 300 has a base 307 and a plurality of fin portions 305 extending away from the base 307. In some embodiments, a plurality of the fin portions 305 are native to the base 307. The base 307 and the plurality of the fin portions 305 are formed from a substrate. In some embodiments, the fin portions 305 are formed through etching an upper portion of the substrate, and the base 307 is a lower portion of the substrate.

In some embodiments, the fin portions 305 are formed through an epitaxial growth process. In some embodiments, the base 307 is formed from a substrate such as a silicon substrate, an epitaxial substrate, a silicon carbide substrate, a silicon-on-insulator (SOI) substrate or the like.

In operation s103, as shown in FIG. 3, a second dielectric layer 333 is formed over the base 307 and the fin portions 305. In some embodiments, the second dielectric layer 333 entirely covers the fin portions 305. In some embodiments, the second dielectric layer 333 includes oxide material and is forming through a chemical vapor deposition (CVD) process or a physical vapor deposition (PVD) process.

In operation s105, as shown in FIG. 3, a second masking layer 337 is disposed over the second dielectric layer 333. The second masking layer 337 has a plurality of second through holes 338 corresponding to a second region 303. In some embodiments, the second masking layer 337 is formed through a chemical vapor deposition (CVD) process or a physical vapor deposition (PVD) process.

In some embodiments, the second masking layer 337 may include a single layer structure having an oxide layer, a nitride layer, or the like. In some embodiments, the second masking layer 337 may include a multi-layer structure having an oxide layer, a nitride layer and so on.

Figure 4:
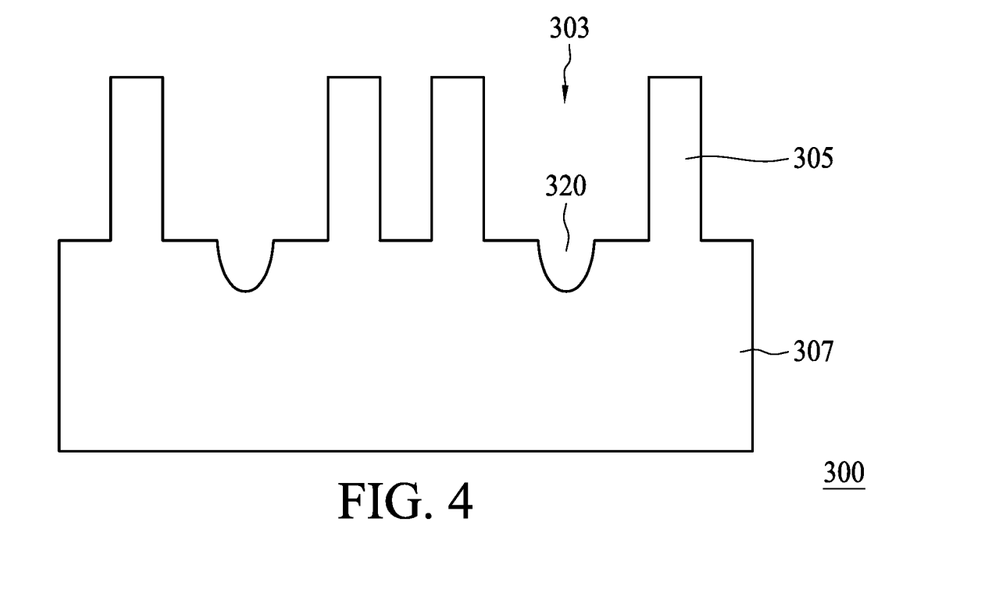

In operation s107, as shown in FIG. 4, portions of the fin structure 300 in the second region 303 are removed to form a plurality of second trenches 320 in the base 307. In some embodiments, the second dielectric layer exposed through the second through holes is partially removed. In some embodiments, the fin portions 305 in the second region 303 are removed to respectively form the second trenches 320. In some embodiments, the fin structure 300 in the second region 303 is removed through a dry etching process. The second trenches 320 are formed corresponding to the second through holes of the second masking layer 337.

Figure 5:
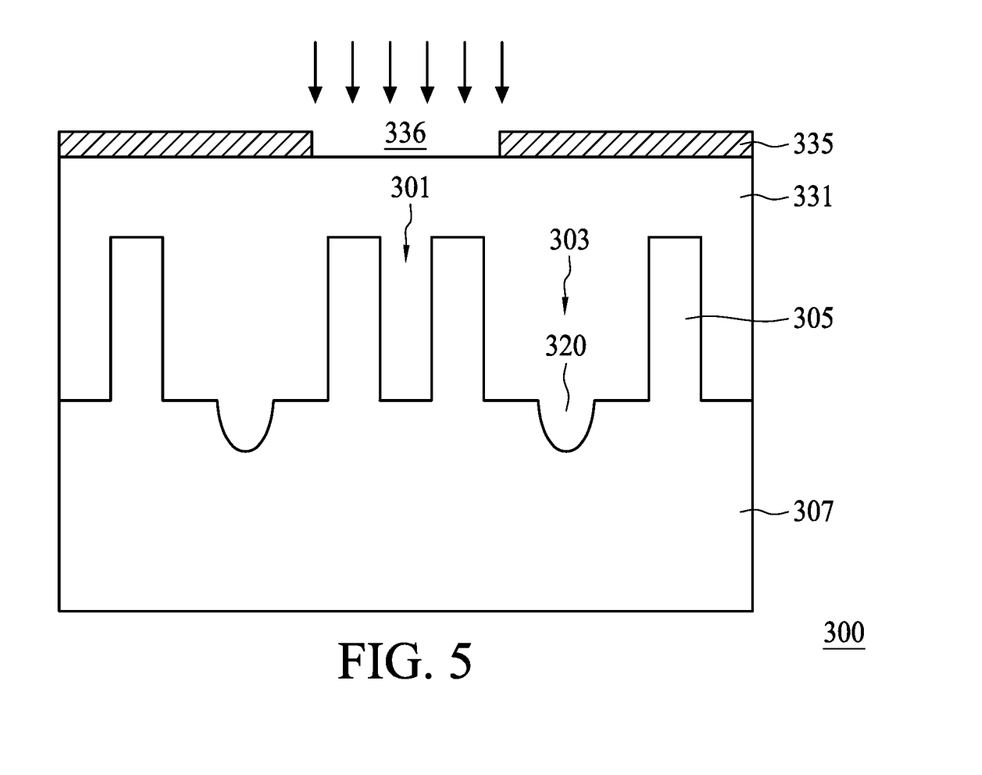

In operation s109, as shown in FIG. 5, a first dielectric layer 331 is formed. The first dielectric layer 331 entirely covers the fin portions 305. In some embodiments, the first dielectric layer 331 is formed over the base 307 and the fin portions 305.

In some embodiments, the first dielectric layer 331 includes oxide material and is formed through a chemical vapor deposition (CVD) process or a physical vapor deposition (PVD) process.

In operation s111, as shown in FIG. 5, a first masking layer 335 is disposed over the first dielectric layer 331. The first masking layer 335 has a first through hole 336 corresponding to a first region 301. In some embodiments, the first masking layer 335 is formed through a chemical vapor deposition (CVD) process or a physical vapor deposition (PVD) process.

In some embodiments, the first masking layer 335 may include a single layer structure having an oxide layer or a nitride layer. In some embodiments, the first masking layer 335 may include a multi-layer structure having an oxide layer and a nitride layer.

Figure 6:
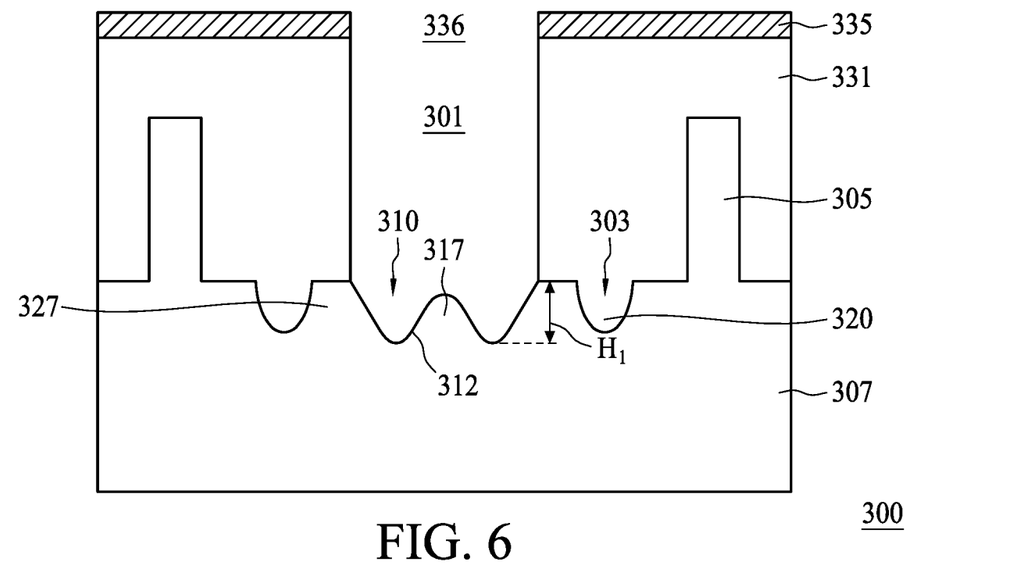

In operation s113, as shown in FIG. 6, the fin structure 300 in the first region 301 is partially removed to form a first trench 310 in the base 307 and a first bump 317 forming in the first trench 310. In some embodiments, the portion of the first dielectric layer 331 exposed by the first through hole 336 is removed. In this way, the first trench 310 and the first bump 317 can provide better isolation.

In some embodiments, in operation s113, as shown in FIG. 6, the fin portions 305 in the first region 301 are removed. In some embodiments, a portion of the fin structure 300 including the fin portions 305 and a portion of the base 307 in the first region 301 is removed through a dry etching process. The first trench 310 is formed below the first through hole 336 of the first masking layer 335.

In some embodiments, the second trenches 320 are formed before the forming of the first trench 310. After the forming of the first trench 310, a plurality of second bumps 327 are respectively formed between the first trench 310 and the second trenches 320. More specifically, the first trench 310 has a first depth H1 as shown in FIG. 6.

Figure 7:
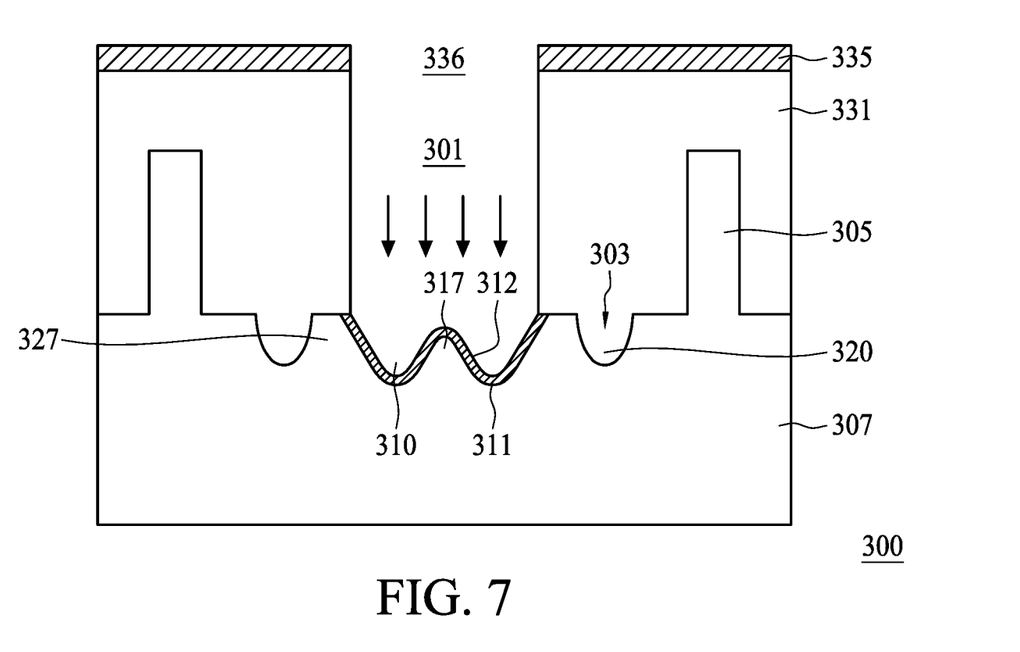

In operation s115, as shown in FIG. 7, a first pre-treatment process is performed on a first exposed surface 312 of the first trench 310. In some embodiments, the first exposed surface 312 of the first trench 310 is cleaned to ensure the first exposed surface 312 is free of contaminants for performing other processes, such as an oxidization process.

After the first pre-treatment process, in operation s117, as shown in FIG. 7, a first oxide layer 311 is formed in the first region 301 of the fin structure 300. In some embodiments, the first oxide layer 311 is formed through oxidizing the first exposed surface 312 of the first trench 310. In some embodiments, the first oxide layer 311 is formed using nitric acid and hydrogen peroxide in a chemical oxidation process. A thickness of the first oxide layer 311 is 10 angstroms. In some embodiments, during the forming of the first oxide layer 311 in the first region 301, the first dielectric layer 331 in a region other than the first region 301 is left in place, instead of being removed after the removing of the fin structure 300 in the first region 301.

Figure 8:
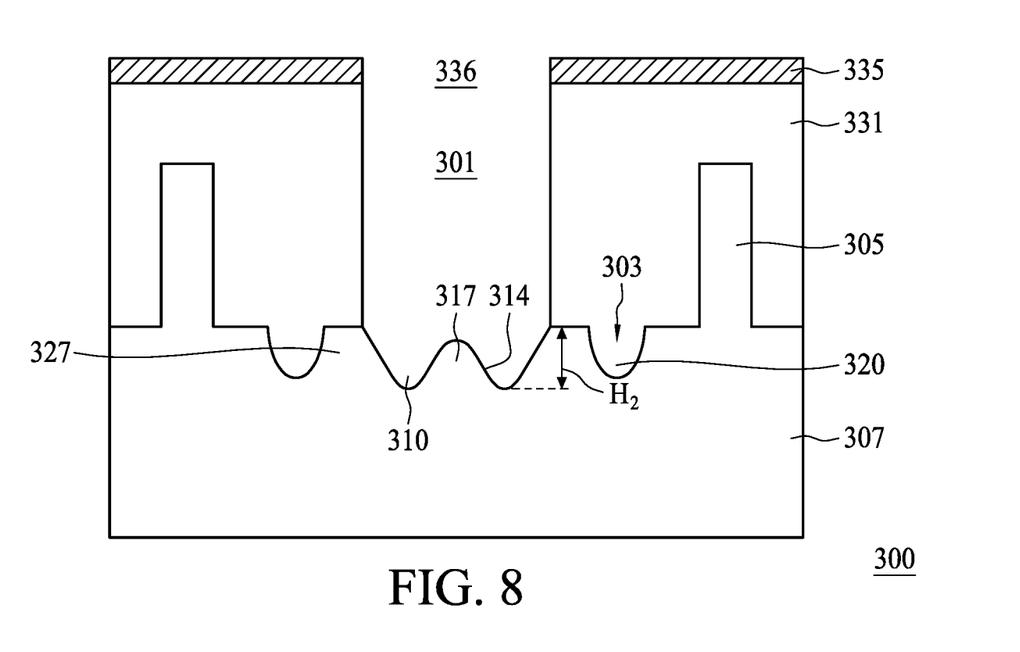

In operation s119, as shown in FIG. 8, the first oxide layer 311 is removed. In this way, corners in the first trench 310 can be made more rounded, which can reduce an effect of parasitic capacitance and result in less disturbance to elements formed subsequently.

More specifically, as shown in FIG. 8, the first trench 310 has a second depth H2 greater than the first depth H1. That is, the first trench 310 can be deeper after removing the first oxide layer 311, and the first trench 310 provides better isolation and leads to less disturbance to elements formed subsequently.

Figure 9:
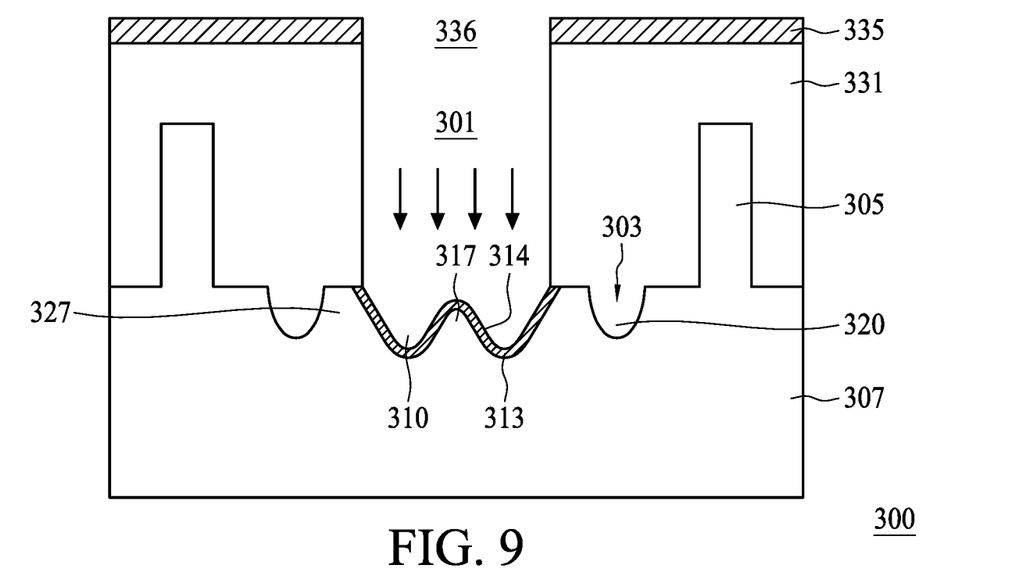

In operation s121, as shown in FIG. 9, a second pre-treatment process is performed on a second exposed surface 314 of the first trench 310. In some embodiments, the second exposed surface 314 of the first trench 310 is cleaned to ensure the second exposed surface 314 is free of contaminants for performing other processes, such as an oxidization process.

After the second pre-treatment process, in operation s123, as shown in FIG. 9, a second oxide layer 313 is formed in the first region 301. In some embodiments, the second oxide layer 313 is formed through oxidizing the second exposed surface 314 of the first trench 310. A thickness of the second oxide layer 313 is 10 angstroms. In some embodiments, the second oxide layer 313 is formed using nitric acid and hydrogen peroxide in a chemical oxidation process. In some embodiments, during the forming of the second oxide layer 313 in the first region 301, the first dielectric layer 331 in a region other than the first region 301 is left in place, instead of being removed after the removing of the portion of the fin structure 300 in the first region 301, which can prevent contamination of the region other than the first region 301.

Figure 10:
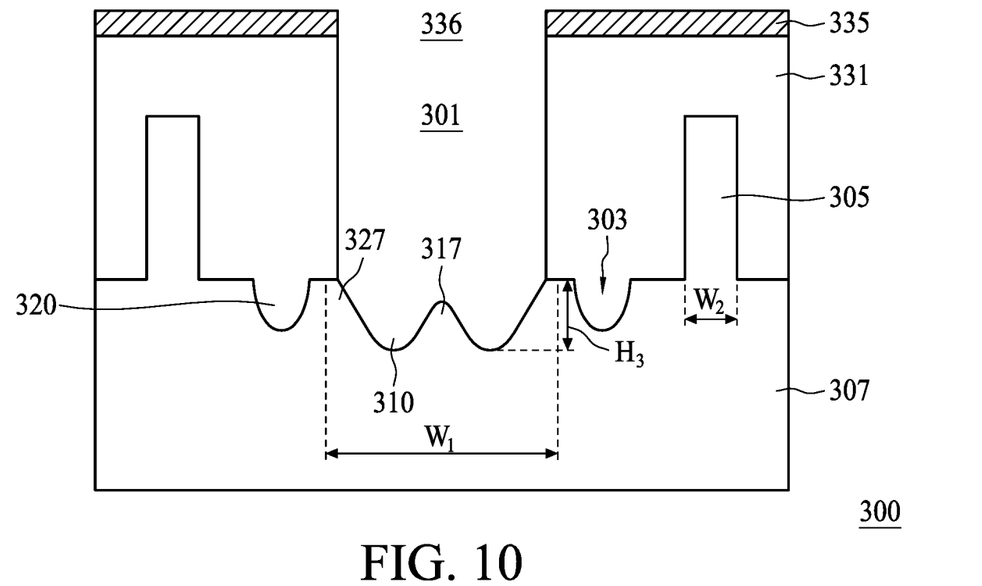

In operation s125, as shown in FIG. 10, the second oxide layer 313 is removed. In this way, corners in the first trench 310 can be made more rounded, which can reduce an effect of parasitic capacitance and result in less disturbance to elements formed subsequently.

More specifically, in the operation s125, as shown in FIG. 10, the first bump 317 has a first width W1 greater than a second width W2 of the fin portions 305. A top of the first bump 317 is not higher than a top surface of the base 307. The first trench 310 has a third depth H3 greater than the second depth H2. That is, the first trench 310 can be deeper after removing the second oxide layer 313, and the first trench 310 can provide better isolation and lead to less disturbance to elements formed subsequently.

In some embodiments, processes of forming the oxide layer and removing the oxide layer can be performed repeatedly in order to provide the first trench 310 with greater depth and reduce disturbance to elements formed subsequently.

Figure 11:
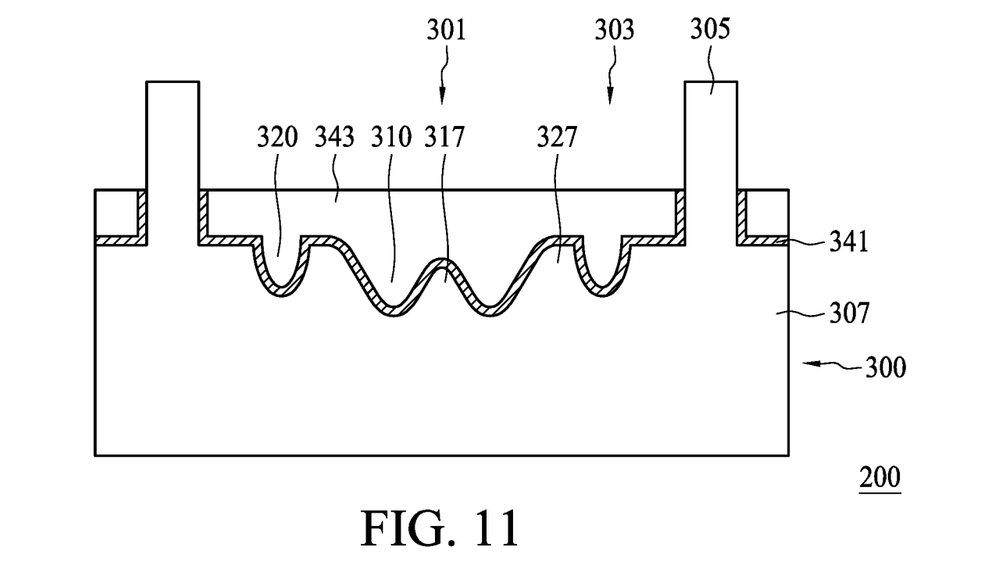

In operation s127, as shown in FIG. 11, a liner structure 341 is formed. The liner structure 341 covers the base 307 of the fin structure 300 and partially covers the plurality of fin portions 305. Next, an isolation layer 343 is formed over the base 307 of the fin structure 300 and covers the liner structure 341. The liner is formed between the fin structure 300 and the isolation layer 343. As a result, a semiconductor structure 200 is formed.

In conclusion, with the design of the method for manufacturing the semiconductor structure, the trench and the bump may be used to provide better isolation and result in less disturbance to elements formed subsequently.

In addition, corners of the semiconductor structure can be made more rounded after forming of a first oxide layer on the exposed surface and removing the oxide layer. Such operations can reduce an effect of parasitic capacitance and result in less disturbance to elements formed subsequently.

Moreover, forming the deeper trench after removing the first oxide layer provides better isolation and leads to less disturbance to elements formed subsequently.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

One aspect of the present disclosure provides a method for manufacturing a semiconductor structure. The method includes providing a fin structure having a base and a plurality of fin portions extending away from the base; partially removing the fin structure in a first region to form a first trench in the base and a first bump formed in the first trench; forming a first oxide layer in the first region; and removing the first oxide layer.

The scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A method for manufacturing a semiconductor structure, comprising:
    providing a fin structure having a base and a plurality of fin portions extending away from the base;
    partially removing the fin structure in a first region to form a first trench in the base and a first bump formed in the first trench;
    oxidizing a first exposed surface of the first trench to form a first oxide layer in the first region of the fin structure; and
    removing the first oxide layer in the first region of the fin structure.

2. The method of claim 1, wherein forming the first oxide layer in the first region of the fin structure includes forming the first oxide layer through a chemical oxidation process.

3. The method of claim 2, wherein forming the first oxide layer in the first region of the fin structure includes forming the first oxide layer by using nitric acid and hydrogen peroxide.

4. The method of claim 1, further comprising:
    forming a first dielectric layer entirely covering the fin portions before partially removing the fin structure in the first region; and
    disposing a first masking layer over the first dielectric layer, wherein the first masking layer has a first through hole corresponding to the first region.

5. The method of claim 4, wherein partially removing the fin structure in the first region further includes:
    removing the first dielectric layer exposed by the first through hole.

6. The method of claim 5, wherein the first dielectric layer in a region other than the first region is left in place during the forming of the first oxide layer in the first region.

7. The method of claim 1, wherein partially removing the fin structure in the first region further includes:
    removing the fin portions in the first region.

8. The method of claim 1, wherein partially removing the fin structure in the first region includes removing the fin structure in the first region through a dry etching process.

9. The method of claim 1, further comprising:
    forming a second oxide layer in the first region after removing the first oxide layer; and
    removing the second oxide layer.

10. The method of claim 9, wherein forming a second oxide layer in the first region includes forming the second oxide layer through oxidizing a second exposed surface of the first trench.

11. The method of claim 10, wherein a first dielectric layer in a region other than the first region is left in place during the forming of the second oxide layer in the first region.

12. The method of claim 10, further comprising:
    performing a second pre-treatment process on the second exposed surface of the first trench before the forming of the second oxide layer through oxidizing the second exposed surface of the first trench.

13. The method of claim 12, further comprising:
    performing a first pre-treatment process on the first exposed surface of the first trench before forming the first oxide layer through oxidizing the first exposed surface of the first trench.

14. The method of claim 1, further comprising:
    partially removing the fin structure in a second region to form a plurality of second trenches in the base.

15. The method of claim 14, further comprising:
    forming the second trenches before the forming of the first trench, and respectively forming a plurality of second bumps between the first trench and the second trenches.

16. The method of claim 14, further comprising:
    forming a second dielectric layer entirely covering the fin portions before partially removing the fin structure in the second region; and
    disposing a second masking layer over the second dielectric layer, wherein the second masking layer has a plurality of second through holes corresponding to the second region.

17. The method of claim 16, wherein partially removing the fin structure in the second region further includes:
    partially removing the second dielectric layer exposed by the second through holes; and removing the fin portions in the second region to respectively form the second trenches.

18. The method of claim 17, wherein partially removing the fin structure in the second region includes removing the fin structure in the second region through a dry etching process.

19. The method of claim 1, further comprising:
    forming a liner structure covering the base of the fin structure and partially covering the plurality of fin portions; and
    forming an isolation layer over the base of the fin structure and covering the liner structure.

* * * * *